(12) United States Patent
Masleid

(10) Patent No.: US 7,724,025 B2
(45) Date of Patent: *May 25, 2010

(54) LEAKAGE EFFICIENT ANTI-GLITCH FILTER

(76) Inventor: Robert Masleid, 17266 Eaton La., Monte Sereno, CA (US) 95930

( * ) Notice: Subject to any disclaimer, the term of this patent is extended or adjusted under 35 U.S.C. 154(b) by 0 days.

This patent is subject to a terminal disclaimer.

(21) Appl. No.: 12/033,712

(22) Filed: Feb. 19, 2008

(65) Prior Publication Data

US 2008/0143376 A1 Jun. 19, 2008

Related U.S. Application Data

(63) Continuation of application No. 11/021,197, filed on Dec. 23, 2004, now Pat. No. 7,332,931, which is a continuation-in-part of application No. 10/864,271, filed on Jun. 8, 2004, now Pat. No. 7,336,103.

(51) Int. Cl.
H03K 17/16 (2006.01)
H03K 19/003 (2006.01)

(52) U.S. Cl. .......................... 326/26; 327/34; 327/276; 326/27

(58) Field of Classification Search .................. 326/26, 326/27, 82, 83, 121; 327/34, 276
See application file for complete search history.

(56) References Cited

U.S. PATENT DOCUMENTS

| | | | |
|---|---|---|---|
| 3,991,380 A | 11/1976 | Pryor | |
| 4,498,021 A | 2/1985 | Uya | |
| 4,700,089 A | 10/1987 | Fujii et al. | |
| 4,739,252 A | 4/1988 | Malaviya et al. | |
| 4,760,279 A * | 7/1988 | Saito et al. | 327/34 |
| 5,039,893 A | 8/1991 | Tomisawa | |
| 5,128,560 A | 7/1992 | Chern et al. | |
| 5,166,555 A | 11/1992 | Kano | |
| 5,227,679 A | 7/1993 | Woo | |
| 5,264,738 A | 11/1993 | Veendrick et al. | |
| 5,297,086 A | 3/1994 | Nasu et al. | |
| 5,410,278 A | 4/1995 | Itoh et al. | |
| 5,414,312 A | 5/1995 | Wong | |
| 5,455,521 A | 10/1995 | Dobbelaere | |

(Continued)

FOREIGN PATENT DOCUMENTS

EP 1398639 3/2004

(Continued)

OTHER PUBLICATIONS

Lima T, et al. "Capacitance Coupling Immmune, Transient Sensitive Accelerator for Resistive Interconnect Signals of Subquater Micron ULSI" IEEE Journal of Solid-State Circuits, IEEE Inc. NewYork, US pp. 531-536.

(Continued)

Primary Examiner—Daniel D Chang

(57) ABSTRACT

A leakage efficient anti-glitch filter. In accordance with a first embodiment of the present invention, a leakage efficient anti-glitch filter with variable delay stages comprises a plurality of variable delay stages and a coincidence detector element for detecting coincidence of an input signal to the delay element and an output of the delay element. The plurality of variable delay stages may comprise stacked inverter circuits or stacked NAND circuits.

20 Claims, 5 Drawing Sheets

U.S. PATENT DOCUMENTS

| | | | |
|---|---|---|---|
| 5,467,038 A | 11/1995 | Motley et al. |
| 5,497,105 A | 3/1996 | Oh et al. |
| 5,525,616 A | 6/1996 | Platt et al. |
| 5,568,103 A | 10/1996 | Nakashima et al. |
| 5,587,665 A | 12/1996 | Jiang |
| 5,594,360 A | 1/1997 | Wojciechowski |
| 5,610,548 A | 3/1997 | Masleid |
| 5,614,845 A | 3/1997 | Masleid |
| 5,656,963 A | 8/1997 | Masleid et al. |
| 5,677,650 A | 10/1997 | Kwasniewski et al. |
| 5,680,359 A | 10/1997 | Jeong |
| 5,698,994 A | 12/1997 | Tsuji |
| 5,739,715 A | 4/1998 | Rawson |
| 5,764,110 A | 6/1998 | Ishibashi |
| 5,767,700 A | 6/1998 | Lee |
| 5,777,501 A | 7/1998 | AbouSeido |
| 5,778,214 A | 7/1998 | Taya et al. |
| 5,791,715 A | 8/1998 | Nebel |
| 5,793,715 A | 8/1998 | Alon et al. |
| 5,796,313 A | 8/1998 | Eitan |
| 5,797,105 A | 8/1998 | Nakaya et al. |
| 5,811,983 A | 9/1998 | Lundberg |
| 5,880,608 A | 3/1999 | Mehta et al. |
| 5,894,419 A | 4/1999 | Galambos et al. |
| 5,926,050 A | 7/1999 | Proebsting |
| 5,963,043 A | 10/1999 | Nassif |
| 5,963,074 A | 10/1999 | Arkin |
| 5,969,543 A | 10/1999 | Erickson et al. |
| 5,977,763 A | 11/1999 | Loughmiller et al. |
| 5,982,211 A | 11/1999 | Ko |
| 6,011,403 A | 1/2000 | Gillette |
| 6,025,738 A | 2/2000 | Masleid |
| 6,028,490 A | 2/2000 | Komatsu |
| 6,031,403 A | 2/2000 | Gerbach |
| 6,069,506 A | 5/2000 | Miller, Jr. et al. |
| 6,087,886 A | 7/2000 | Ko |
| 6,111,447 A | 8/2000 | Ternullo, Jr. |
| 6,114,840 A | 9/2000 | Farrell et al. |
| 6,127,872 A | 10/2000 | Kumata |
| 6,154,099 A | 11/2000 | Suzuki et al. |
| 6,154,100 A | 11/2000 | Okamoto |
| 6,160,755 A | 12/2000 | Norman et al. |
| 6,172,545 B1 * | 1/2001 | Ishii ........................... 327/276 |
| 6,172,943 B1 | 1/2001 | Yuzuki |
| 6,188,260 B1 | 2/2001 | Stotz et al. |
| 6,198,334 B1 | 3/2001 | Tomobe et al. |
| 6,204,710 B1 | 3/2001 | Goetting et al. |
| 6,229,747 B1 | 5/2001 | Cho et al. |
| 6,242,936 B1 | 6/2001 | Ho et al. |
| 6,242,937 B1 | 6/2001 | Lee et al. |
| 6,262,601 B1 | 7/2001 | Choe et al. |
| 6,275,091 B1 | 8/2001 | Saeki |
| 6,281,706 B1 | 8/2001 | Wert et al. |
| 6,285,230 B1 | 9/2001 | Na |
| 6,294,930 B1 | 9/2001 | Goetting et al. |
| 6,321,282 B1 | 11/2001 | Horowitz et al. |
| 6,323,706 B1 | 11/2001 | Stark et al. |
| 6,366,115 B1 | 4/2002 | DiTommaso |
| 6,407,571 B1 | 6/2002 | Furuya et al. |
| 6,426,641 B1 | 7/2002 | Koch et al. |
| 6,426,652 B1 | 7/2002 | Greenhill et al. |
| 6,455,901 B2 | 9/2002 | Kameyama et al. |
| 6,459,319 B2 | 10/2002 | Sako |
| 6,466,063 B2 | 10/2002 | Chen |
| 6,476,632 B1 | 11/2002 | La Rosa et al. |
| 6,489,796 B2 | 12/2002 | Tomishima |
| 6,522,185 B2 * | 2/2003 | Helt et al. ................... 327/276 |
| 6,535,014 B2 | 3/2003 | Chetlur et al. |
| 6,538,471 B1 | 3/2003 | Stan et al. |
| 6,538,522 B1 | 3/2003 | Aipperspach et al. |
| 6,545,519 B1 | 4/2003 | Carballo |
| 6,570,407 B1 | 5/2003 | Sugisawa et al. |
| 6,573,777 B2 | 6/2003 | Saint-Laurent et al. |
| 6,577,157 B1 | 6/2003 | Cheung et al. |
| 6,577,176 B1 | 6/2003 | Masleid et al. |
| 6,621,318 B1 | 9/2003 | Burr |
| 6,657,504 B1 | 12/2003 | Deal et al. |
| 6,664,837 B1 | 12/2003 | Oh et al. |
| 6,690,242 B2 | 2/2004 | Fang et al. |
| 6,697,929 B1 | 2/2004 | Cherkauer et al. |
| 6,724,214 B2 | 4/2004 | Manna et al. |
| 6,731,140 B2 | 5/2004 | Masleid et al. |
| 6,731,179 B2 | 5/2004 | Abadeer et al. |
| 6,759,863 B2 | 7/2004 | Moore |
| 6,762,638 B2 | 7/2004 | Correale, Jr. et al. |
| 6,762,966 B1 | 7/2004 | LaRosa et al. |
| 6,768,363 B2 | 7/2004 | Yoo et al. |
| 6,774,734 B2 | 8/2004 | Christensen et al. |
| 6,798,230 B1 | 9/2004 | Taylor et al. |
| 6,815,971 B2 | 11/2004 | Wang et al. |
| 6,815,977 B2 | 11/2004 | Sabbavarapu et al. |
| 6,831,494 B1 | 12/2004 | Fu et al. |
| 6,879,200 B2 | 4/2005 | Komura et al. |
| 6,882,172 B1 | 4/2005 | Suzuki et al. |
| 6,885,210 B1 | 4/2005 | Suzuki |
| 6,903,564 B1 | 6/2005 | Suzuki |
| 6,924,669 B2 | 8/2005 | Itoh et al. |
| 7,053,660 B2 | 5/2006 | Itoh et al. |
| 7,053,680 B2 | 5/2006 | Masleid et al. |
| 7,119,580 B2 | 10/2006 | Masleid et al. |
| 7,142,018 B2 | 11/2006 | Masleid et al. |
| 7,173,455 B2 | 2/2007 | Masleid et al. |
| 7,239,170 B2 | 7/2007 | Suen et al. |
| 7,271,638 B2 | 9/2007 | Takai et al. |
| 7,295,041 B1 | 11/2007 | Masleid et al. |
| 7,304,503 B2 | 12/2007 | Masleid et al. |
| 7,336,103 B1 | 2/2008 | Masleid et al. |
| 2001/0000426 A1 | 4/2001 | Sung et al. |
| 2001/0028278 A1 | 10/2001 | Ooishi |
| 2001/0030561 A1 | 10/2001 | Asano et al. |
| 2001/0052623 A1 | 12/2001 | Kameyama et al. |
| 2002/0056016 A1 | 5/2002 | Horowitz et al. |
| 2002/0178415 A1 | 11/2002 | Saraf |
| 2003/0005775 A1 | 1/2003 | Washeleski et al. |
| 2003/0011413 A1 | 1/2003 | Masleid |
| 2003/0042960 A1 * | 3/2003 | Gomm ....................... 327/276 |
| 2003/0057775 A1 | 3/2003 | Yamashita et al. |
| 2003/0160630 A1 | 8/2003 | Earle |
| 2003/0189465 A1 | 10/2003 | Abadeer et al. |
| 2003/0231713 A1 | 12/2003 | Masleid et al. |
| 2004/0104731 A1 | 6/2004 | Vollertsen |
| 2004/0119501 A1 | 6/2004 | Sabbavarapu et al. |
| 2004/0119503 A1 | 6/2004 | Jamshidi et al. |
| 2004/0124900 A1 | 7/2004 | Brox |
| 2004/0148111 A1 | 7/2004 | Gauthier et al. |
| 2004/0257115 A1 | 12/2004 | Bertram et al. |
| 2005/0184720 A1 | 8/2005 | Bernstein et al. |
| 2005/0212547 A1 | 9/2005 | Suzuki |
| 2005/0248368 A1 | 11/2005 | Bertram et al. |

FOREIGN PATENT DOCUMENTS

| | | | |
|---|---|---|---|
| JP | 03089624 | | 4/1991 |
| JP | 04091516 | | 3/1992 |
| JP | 06216723 | | 8/1994 |
| JP | 06216723 A | * | 8/1994 |

OTHER PUBLICATIONS

Nalamalpu, et al Boosters for Driving Long Onchip Interconnects-Design Issues, Interconnect Synthesis, and Comparision with Repeaters, Jan. 2002, IEEE Transactions on Computer-Aided Design on Integrated Circuits and Systems, vol. 21, No. 1, pp. 50-62.

Taub, et al., Digital Integrated Electronics, 1977, McGraw-Hill, Inc. pp. 98-100.

Chen, G et al., "DynamicNBTI of p-MOS Transistors and its Impact on MOSFET Scaling" IEE Electron Device Letters, 2002.

Oner et al., "A Compact Monitoring Circuit for Real-Time On-Chip Diagnosis of Hot-Carrier Induced Degradation" Microelectronic test structures. Proceedings, IEEE International Conference in Monterey, Ca. Mar. 17, 1997-Mar. 20, 1997, pp. 72-76.

Reddy. V. et al., "Impact of Negative Bias Temperature Instability on Digital Circuit Reliability". 2002 IEE International Reliabilty Physics Symposium Proceedings, Dallas, TX Apr. 7, 2002-Apr. 11, 2002.

Ryhoei Kaneda, Translation of Japanese Kokai Patent Application No. Hei [1991]-89624, publication date: Apr. 15, 1991, pp. 1-6.

Rhyne, "Fundamentals of Digital Systems Design", N.J. 1973, pp. 70-71.

Stojanovic, V. and Oklobdzija, V., "Comparative Analysis of Master-Slave Latches and Flip-Flops for High-Performance and Low-Power Systems", IEEE Journal of Solid-State Circuits, vol. 34, No. 4, Apr. 1999, pp. 536-548.

* cited by examiner

LEAKAGE EFFICIENT ANTI-GLITCH FILTER

RELATED APPLICATIONS

This is a Continuation Application of, and claims benefit to, co-pending U.S. patent application Ser. No. 11/021,197, filed Dec. 23, 2004, to Masleid, which is hereby incorporated herein by reference in its entirety, which is a Continuation-in-Part of co-pending, commonly owned U.S. patent application Ser. No. 10/864,271, filed Jun. 8, 2004, entitled "Stacked Inverter Delay Chain" to Masleid and Burr, which is hereby incorporated herein by reference in its entirety.

This Application is related to the following, commonly assigned United States Patents or Applications, which are hereby incorporated herein by reference in their entirety:

U.S. patent application Ser. No. 11/021,222, filed Dec. 23, 2004, entitled "A Configurable Tapered Delay Chain with Multiple Sizes of Delay Elements" by Masleid;

U.S. patent application Ser. No. 11/021,221, filed Dec. 23, 2004, entitled "A Configurable Delay Chain with Switching Control for Tail Delay Elements" by Masleid;

U.S. patent application Ser. No. 11/021,632, filed Dec. 23, 2004, entitled "Power Efficient Multiplexer" to Masleid;

U.S. patent application Ser. No. 11/020,746, filed Dec. 23, 2004, now U.S. Pat. No. 7,310,008, entitled "A Configurable Delay Chain with Stacked Inverter Delay Elements" by Masleid; and U.S. patent application Ser. No. 11/021,633, filed Dec. 23, 2004, now U.S. Pat. No. 7,330,054, entitled "Leakage Efficient Anti-glitch Filter" by Masleid.

FIELD OF THE INVENTION

Embodiments in accordance with the present invention relate to leakage efficient anti-glitch filters with variable delay stages.

BACKGROUND

It is sometimes advantageous to delay propagation of a signal through an integrated circuit. A common approach to create such signal delays is to insert a delay circuit, or delay "line," into a signal path. One well known class of delay circuits is a variable delay circuit. For example, a variable delay circuit can function by selectably varying a number of delay elements to produce different amounts of delay to a signal propagating through such elements. However, in general, variable delay lines can generate "glitches" or deleterious spurious signals. For example, changing a delay duration while a transition is propagating through the delay line can sometimes cause the transition to arrive twice at the output, producing a glitch. Further, it is generally desirable for delay circuit designs to be efficient in terms of integrated circuit die area, active power consumption and static power (leakage current) consumption.

SUMMARY OF THE INVENTION

A leakage efficient anti-glitch filter with variable delay stages is disclosed. In accordance with a first embodiment of the present invention, a leakage efficient anti-glitch filter with variable delay stages comprises a plurality of variable delay stages and a coincidence detector element for detecting coincidence of an input signal to the delay element and an output of the delay element. The plurality of variable delay stages may comprise stacked inverter circuits or stacked NAND circuits.

In accordance with another embodiment of the present invention, a method of delaying an electronic signal is disclosed. An electronic signal is accessed. A delayed version of the electronic signal is produced through a variable number of delay stages. The electronic signal and the delayed version of the electronic signal are combined to produce a glitch-free delayed electronic signal. The glitch-free delayed electronic signal transitions in response to a coincidence of the electronic signal and the delayed version of the electronic signal.

In accordance with still another embodiment of the present invention, an electronic circuit is disclosed. The electronic circuit comprises a delay line comprising a plurality of stacked inverters coupled in series. Each of the plurality of stacked inverters comprises at least two devices of a first type coupled in series, coupled in series to at least two devices of an opposite type coupled in series. The electronic circuit further comprises a plurality of multiplexers corresponding to the plurality of delay stages for selecting between a signal present at a desired delay stage and a signal propagating from beyond a delay stage corresponding to a multiplexer. The electronic circuit further comprises a coincidence detector circuit. The coincidence detector circuit comprises first and second devices of a first type coupled in series, coupled in series to third and fourth devices of a second type coupled in series. An input to the delay line is coupled to gates of the first and fourth devices and an output of the delay line is coupled to gates of the second and third devices.

DETAILED DESCRIPTION OF THE INVENTION

In the following detailed description of the present invention, leakage efficient anti-glitch filter with variable delay stages, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Leakage Efficient Anti-Glitch Filter

Embodiments in accordance with the present invention are described in the context of design and operation of integrated semiconductors. More particularly, embodiments of the present invention relate to leakage efficient anti-glitch filters. It is appreciated, however, that elements of the present invention may be utilized in other areas of semiconductor design and operation.

The following description of embodiments in accordance with the present invention is directed toward pFETs (or p-type metal oxide semiconductor field effect transistors (MOSFETS)) formed in surface N-wells and/or nFETs (or n-type MOSFETS) formed in surface P-wells when a p-type substrate and an N-well process are utilized. It is to be appreciated, however, that embodiments in accordance with the present invention are equally applicable to nFETs (or n-type MOSFETS) formed in surface P-wells and/or pFETs (or p-type MOSFETS) formed in surface N-wells when an n-type substrate and a P-well process are utilized. Consequently, embodiments in accordance with the present invention are well suited to semiconductors formed in both p-type and n-type materials, and such embodiments are considered within the scope of the present invention.

Figure 1:
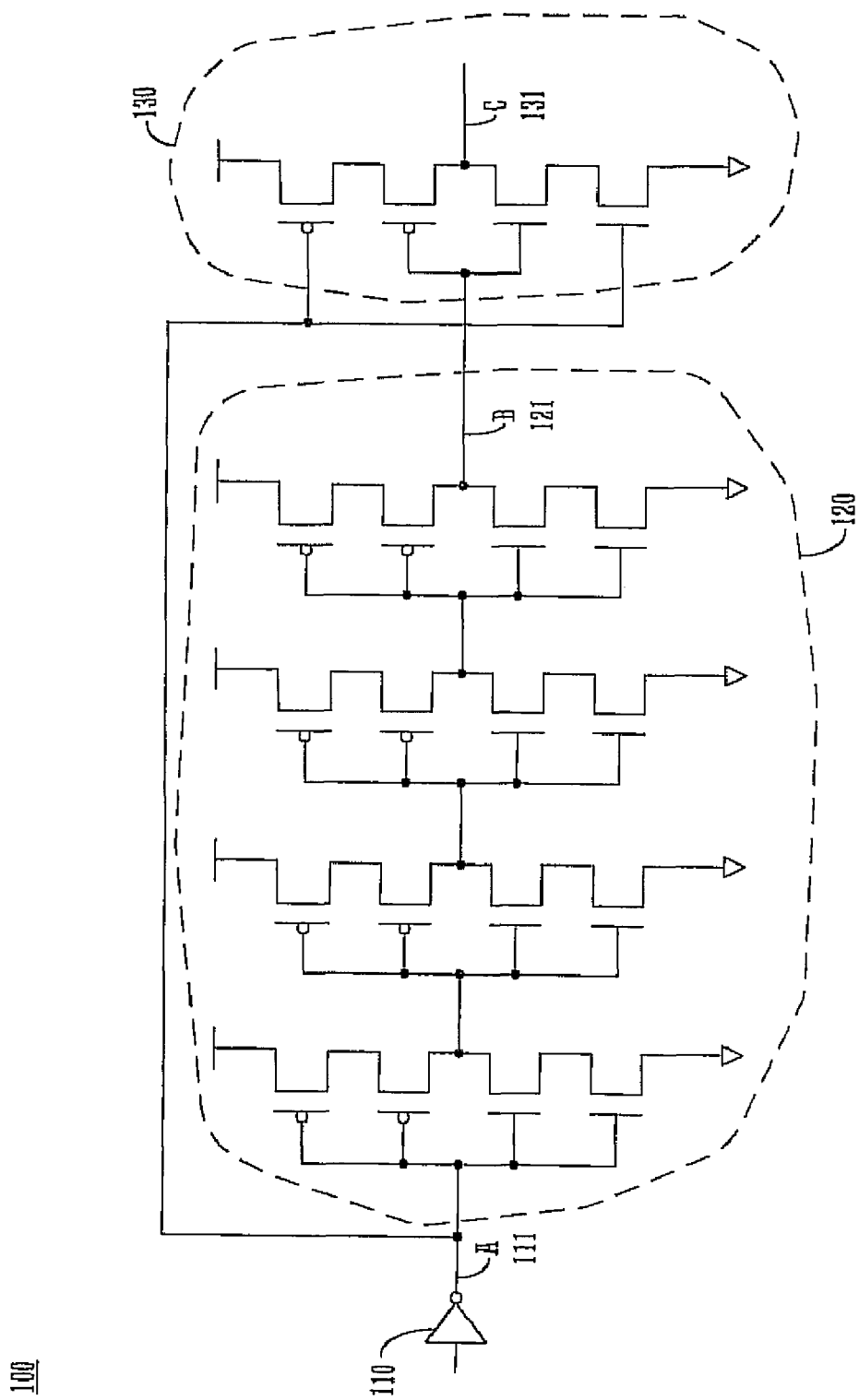
FIG. 1 illustrates a schematic of a novel leakage efficient anti-glitch filter, in accordance with embodiments of the present invention.

FIG. 1 illustrates a schematic of a novel leakage efficient anti-glitch filter 100, in accordance with embodiments of the present invention. Leakage efficient anti-glitch filter 100 comprises an optional input buffer 110, a leakage efficient delay line 120 and a coincidence detector element 130.

Optional input buffer 110 can provide transition speed isolation. For example, without optional input buffer 110, leakage efficient delay line 120 presents six loads at its input. Such loading may represent an undesirable loading condition to the source of a signal. In accordance with embodiments of the present invention, input buffer 110 is well suited to a variety of buffering structures, including, for example, conventional or stacked inverters and non-inverting buffers.

It is to be appreciated that static power consumption in modern semiconductor processes, e.g., processes with a minimum feature size of about 0.13 microns and smaller, is no longer a negligible component of total power consumption. For such processes, static power may be one-half of total power consumption. Further, static power, as a percentage of total power, is tending to increase with successive generations of semiconductor process.

Embodiments in accordance with the present invention offer significant advantages in reducing leakage current, or static power consumption, in comparison with the conventional art. In general, an inverter stage, whether conventional or stacked, forms a leakage path, e.g., a series "string" of devices coupled from operating voltage (Vdd) to ground. As current leaks out of such leakage paths, static power is consumed by the inverter stage. As described more completely in U.S. patent application Ser. No. 10/864,271, entitled "Stacked Inverter Delay Chain" to Masleid and Burr, incorporated herein by reference in its entirety, a delay chain comprising stacked inverters can require fewer stages than a delay chain comprising conventional inverters to produce a comparable delay. For example, each stage of stacked inverters will generally produce greater delay than a conventional, non-stacked inverter. Fewer stages result in fewer leakage paths, resulting in advantageously less leakage current, resulting in less static power consumption.

Further, such leakage paths within a stacked inverter suffer less leakage than a conventional inverter, yielding additional beneficial leakage reductions. In a conventional inverter, exactly one transistor is on while the other transistor is off. As an unfortunate consequence, approximately the full bias voltage is applied to the off transistor, resulting in a maximum possible leakage for the off transistor.

In contrast, in a stacked inverter multiple transistors are either on or off in series. For example, in the embodiment of FIG. 1, for a "high" state, two transistors are on, while two transistors are off. Consequently, each "off" transistor has significantly less than full bias voltage applied. It is appreciated that leakage current generally decreases exponentially as voltage decreases. For example, a factor of two reduction in off bias voltage produces about a factor of eight reduction in leakage current per leakage path.

It is to be further appreciated that such leakage induces non zero voltages at intermediate nodes between the off transistors Such voltages induce body effects in the transistors. Such body effects increase the threshold voltage of the affected transistors. An increased threshold voltage generally produces beneficial decreases in leakage current.

Consequently, in addition to a decrease in a number of leakage paths, in accordance with embodiments of the present invention, the leakage current of each path is very beneficially reduced due to an induced body effect and a highly non-linear relationship between bias voltage and leakage current. Thus, leakage efficient delay line 120 significantly reduces static power consumption, in comparison to a delay line comprising conventional inverters.

Leakage efficient delay line 120 comprises a plurality of stacked inverters. The output of a first stacked inverter is generally coupled to the input of a subsequent stacked inverter. It is to be appreciated that more or fewer stacked inverters can be included in leakage efficient delay line 120 in order to achieve differing signal delay values, in accordance with embodiments of the present invention.

For example, physical differences between electrons and holes, and between n-type and p-type dopants, as well as constructive differences in device geometry and dopant placement, result in differences in efficiency between n-type devices and p-type devices. Because electron mobility is higher than hole mobility, n-type devices are more efficient than p-type devices. However, the degree of difference depends on constructive differences that can vary with process. Such physical and constructive differences also produce other behavior differences, such as a difference in sensitivity to body effects. Consequently, different levels of benefit, e.g., in leakage reduction, are to be expected between stacks of n-type devices and stacks of p-type devices. To allow for such effects, in accordance with embodiments of the present invention, it is possible to stack different numbers of transistors on either or both legs of a stacked inverter. Such variations allow increases in load and/or decreases in drive capability, enabling a wide variety of delay values, as well as enabling differing body effects.

In contrast to a conventional inverter, the stacked inverters of leakage efficient delay line 120 comprise more than a single p-type device coupled to a single n-type device. Rather, the stacked inverters of leakage efficient delay line 120 comprise multiple p-type devices and multiple n-type devices. In the embodiment of FIG. 1, the inverters are shown as comprising two p-type devices and two n-type devices. It is appreciated that embodiments of the present invention are well suited to a variety of stacking combinations of p-type and n-type devices, as well as to other delay elements, for example leakage efficient, e.g., stacked, NAND gates.

As will be discussed further below, the signal delay produced by leakage efficient delay line 120 is related to the duration of spurious signals, or glitches, that are to be filtered by leakage efficient anti-glitch filter 100.

Still referring to FIG. 1, coincidence detector element 130 functions to combine signal A 111, the input of leakage efficient delay line 120, with signal B 121, the output of leakage efficient delay line 120. Coincidence detector element 130 will only propagate a signal when signals A 111 and B 121 coincide.

In the embodiment of FIG. 1, coincidence detector element 130 comprises a "Mueller-C" element. It is appreciated that embodiments of the present invention are well suited to other types of coincidence detectors. A Mueller-C element is a well known special type of NAND gate characterized by propagating a state change only when both of its inputs agree. For example, a true NAND (or AND) gate can transition from true to false when only one of its inputs changes from true to false. In contrast, coincidence detector element 130 does not transition until all inputs agree. e.g., both inputs change from true to false.

For example, only when both signal A 111 and signal B 121 are low will the pFET devices of coincidence detector element 130 turn on and pull output signal C 131 to a high condition. Similarly, only when both signal A 111 and signal B 121 are high will the nFET devices of coincidence detector element 130 turn on and pull output C 131 to a low condition.

Conventionally, coincidence detector elements, e.g., a Mueller-C element, are generally utilized to compare or combine disparate signals. For example, a conventional use of such elements is to determine completion of a logic function.

In contrast, in accordance with embodiments of the present invention, coincidence detector element 130 receives as input the input to leakage efficient delay line 120 and the output of leakage efficient delay line 120. Thus, coincidence detector element 130 receives a signal and a delayed version of the same signal.

Leakage efficient anti-glitch filter 100 suppresses any glitch or spurious signal characterized as having a duration of less than the delay characteristic of leakage efficient delay line 120.

It is generally desirable for a delay circuit, e.g., leakage efficient delay line 120, to track speed changes of other circuitry of an integrated circuit. It is appreciated that a variety of factors, e.g., operating voltage, operating temperature and/or manufacturing process variations, can affect the speed of operation of an integrated circuit. For example, if other circuits of an integrated circuit operate faster, generally less absolute delay is required from a delay circuit for the overall circuit to function. By way of further example, if other circuits of an integrated circuit operate more slowly, it may be advantageous for leakage efficient delay line 120 to operate more slowly, e.g., with greater absolute delay, in order to remove longer glitches generated by such slower operating other circuitry. Because embodiments in accordance with the present invention comprise stacked devices, they are similar to many logic circuits that also comprise stacked devices, e.g., NAND and/or NOR logic gates. Consequently, embodiments in accordance with the present invention match or track changes in operating speed of complex logic more accurately than delay chains comprising very simple inverters.

Embodiments in accordance with the present invention are thus shown to offer significant and highly beneficial improvements in tracking timing changes of other circuits and in static power (leakage current) consumption in comparison to the conventional art.

Figure 2:
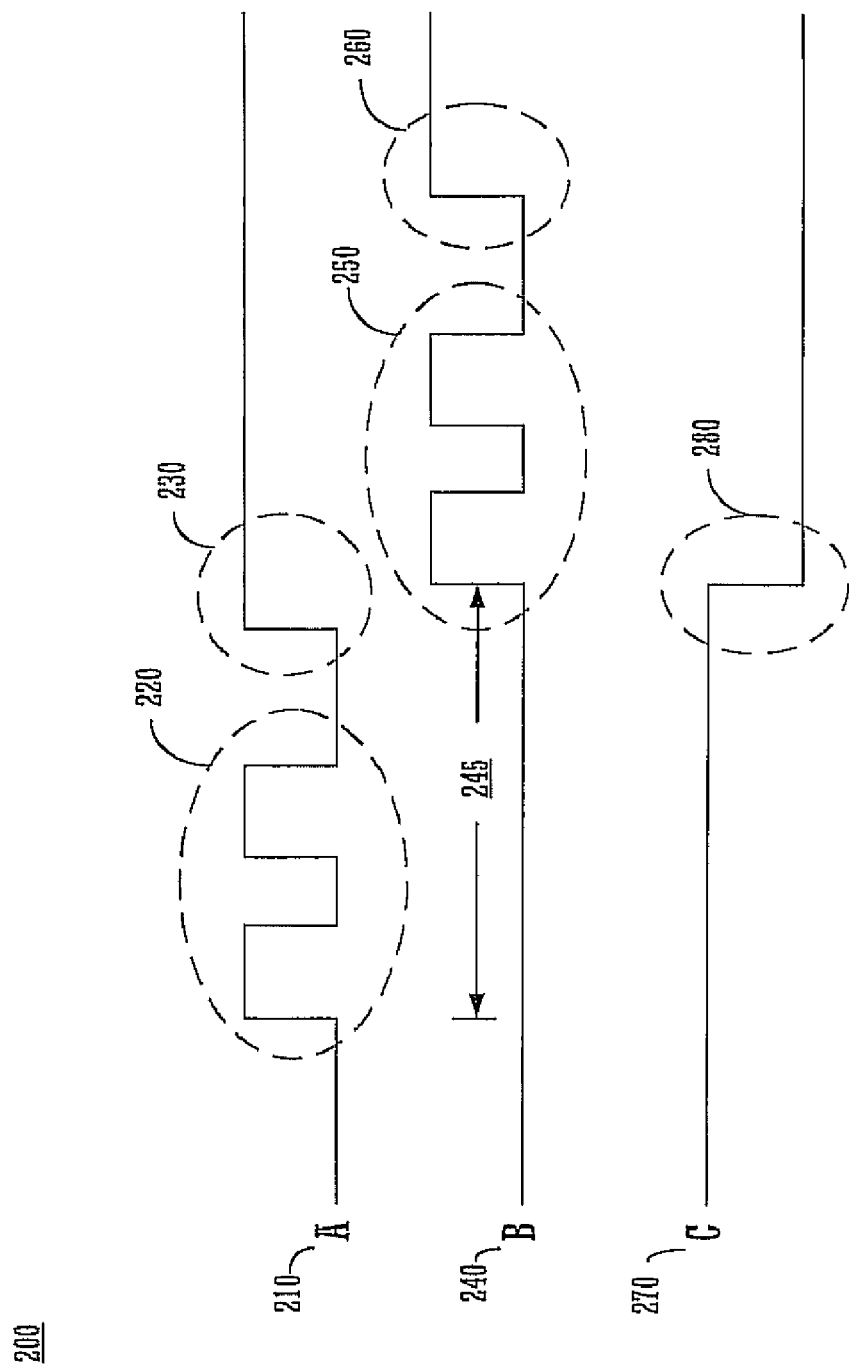
FIG. 2 is a timing diagram illustrating a function of a leakage efficient anti-glitch filter, in accordance with embodiments of the present invention.

FIG. 2 is a timing diagram 200 illustrating a function of leakage efficient anti-glitch filter 100, in accordance with embodiments of the present invention. Timing diagram 200 shows a relationship among exemplary signals associated with leakage efficient anti-glitch filter 100.

Signal A 210 is an input waveform to leakage efficient anti-glitch filter 100. Signal A 210 is one possible signal corresponding to signal A 111 of FIG. 1. Signal A 210 comprises a glitch 220 and a desired transition 230.

Signal B 240 is a delayed version of signal A 210, corresponding to the output B 121 of leakage efficient delay line 120 (FIG. 1). Signal B 240 is a reproduction of signal A 210, delayed by a duration 245. It is to be appreciated that duration 245 corresponds to the delay of leakage efficient delay line 120 of FIG. 1. Signal B 240 comprises a glitch 250, corresponding to glitch 220, and a desired transition 260, corresponding to desired transition 230. It is to be appreciated that glitch 250 and desired transition 260 are delayed by duration 245 in relation to their corresponding elements of signal A 210. It is to be further appreciated that glitch 220 is of a time duration that is less than delay duration 245.

Signal C 270 is an output of leakage efficient delay line 120 as viewed at output C 131 (FIG. 1) when excited by signal A 210. It is appreciated that desired transition 280 of signal C 270 does not occur until both signal A 210 and signal B 240 agree. For example, at a time before desired transition 280, signal B 240 is low. Consequently, changes in signal A 210, e.g., glitch 220 and/or desired transition 230, do not affect signal C 270.

At the time of desired transition 280, signal A 210 is high, and signal B 240 transitions to high. Consequently, signal C 270 transitions to low, producing desired transition 280. As signal A 210 is high for the remaining duration of timing diagram 200, changes in signal B 240, e.g., glitch 250 and/or desired transition 260, do not affect signal C 270.

Thus, in accordance with embodiments of the present invention, a spurious signal, e.g., glitch 220, present on an input to leakage efficient anti-glitch filter 100 (FIG. 1) is removed, and is not present on the output of leakage efficient anti-glitch filter 100.

It is to be appreciated that signal C 270 is inverted relative to signal A 210. Referring once again to FIG. 1, the output of leakage efficient anti-glitch filter 100, e.g., signal C 131, can be inverted by an inverting circuit (not shown) to obtain a positive phase relationship to a signal input to leakage efficient anti-glitch filter 100. Alternatively, an inverting optional input buffer 110 can "pre-invert" a signal input to leakage efficient anti-glitch filter 100 in order to obtain a positive phase relationship between an input signal and an output signal.

Figure 3:
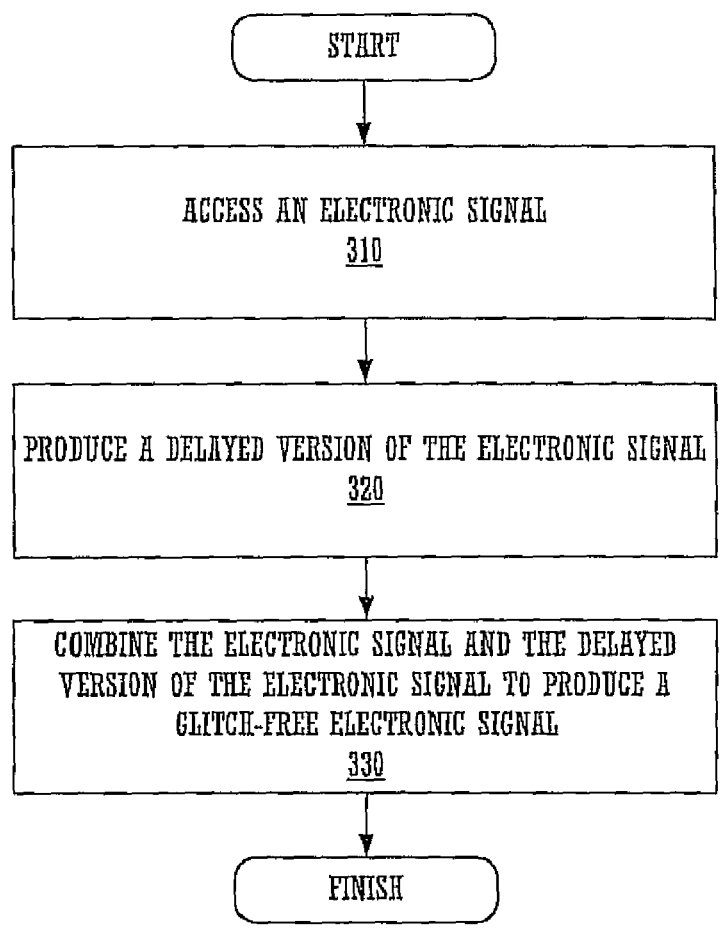
FIG. 3 illustrates a flow chart describing a method of filtering glitches from an electronic signal, in accordance with embodiments of the present invention.

FIG. 3 illustrates a flow chart describing a method 300 of filtering glitches from an electronic signal, in accordance with embodiments of the present invention. In 310, an electronic signal is accessed. For example, referring once again to FIG. 1, signal A 111 is accessed by leakage efficient anti-glitch filter 100.

In 320, a delayed version of the electronic signal is produced. For example, signal B 121 is a delayed version of signal A 111 in FIG. 1. In 330, the electronic signal and the delayed version of the electronic signal are combined to produce a glitch-free electronic signal. The glitch-free electronic signal transitions in response to a coincidence of the electronic signal and the delayed version of the electronic signal.

Leakage Efficient Anti-Glitch Filter with Variable Delay Stages

Figure 4:
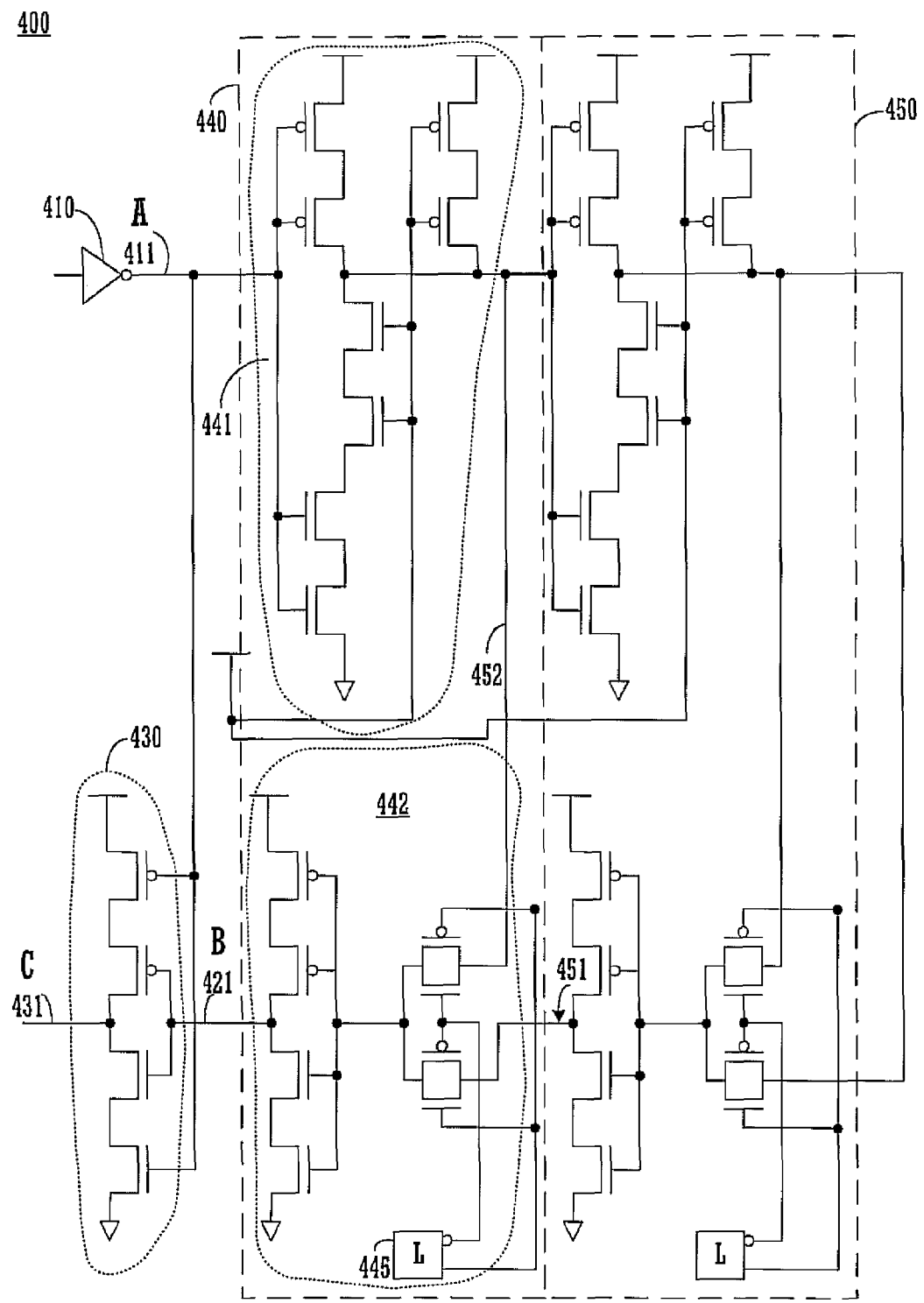
FIG. 4 illustrates a leakage efficient anti-glitch filter with variable delay stages, in accordance with embodiments of the present invention.

FIG. 4 illustrates a leakage efficient anti-glitch filter with variable delay stages 400, in accordance with embodiments of the present invention. It is to be appreciated that the embodiment of FIG. 4 illustrates a variable delay chain with uniform delay stages. Embodiments in accordance with the present invention are well suited to a wide variety of delay chains, including non-uniform, e.g., tapered, delay chains and/or delay chains with variable elements per tap. It is to be further appreciated that embodiments in accordance with the present invention are well suited to greater numbers of selectable delay stages than illustrated.

Leakage efficient anti-glitch filter with variable delay stages 400 comprises a plurality of selectable delay stages, e.g., selectable delay stages 440 and 450. It is appreciated that selectable delay stages 440 and 450 form a variable delay line. Each selectable delay stage comprises a delay element, e.g., delay element 441 of selectable delay stage 440.

In the embodiment of FIG. 4, delay element 441 comprises a stacked 2-input NAND gate. It is to be appreciated that other types of delay elements, e.g., a stacked inverter, are well suited to embodiments in accordance with the present invention. It is to be appreciated that a delay chain comprising stacked NAND gates can require fewer stages than a delay chain comprising conventional NAND gates to produce a comparable delay. For example, each stage of stacked NAND gates will generally produce greater delay than a conventional, non-stacked NAND gate. Fewer stages result in fewer leakage paths, resulting in advantageously less leakage current, resulting in less static power consumption.

It is appreciated that leakage current generally decreases exponentially as voltage decreases. For example, a factor of two reduction in off bias voltage produces about a factor of eight reduction in leakage current per leakage path. Consequently, as the operating voltage is distributed across more devices in a stacked NAND gate, as opposed to a conventional NAND gate, each "off" transistor has significantly less than full bias voltage applied, and that this effect further reduces leakage current.

It is to be further appreciated that current leakage induces non zero voltages at intermediate nodes between the off transistors. Such voltages induce body effects in the transistors. Such body effects increase the threshold voltage of the affected transistors. An increased threshold voltage generally produces beneficial decreases in leakage current.

Consequently, in addition to a decrease in a number of leakage paths, in accordance with embodiments of the present invention, the leakage current of each path is very beneficially reduced due to an induced body effect and a highly non-linear relationship between bias voltage and leakage current. Thus, delay element 441 significantly reduces static power consumption, in comparison to a delay element comprising conventional NAND gates or conventional inverters.

The 2-input NAND gate of the illustrated embodiment advantageously tracks timing changes, e.g., due to process variation, operating voltage and/or operation temperature, of other similarly constructed elements. For example, co-pending, commonly owned U.S. patent application Ser. No. 11/021,221, filed Dec. 23, 2004, entitled "A Configurable Delay Chain with Switching Control for Tail Delay Elements" to Masleid, incorporated herein in its entirety by reference, discloses a variable delay chain comprising a plurality of 2-input NAND gates as delay and control elements. Delay element 441 can beneficially track timing changes of such exemplary variable delay chain elements.

Leakage efficient anti-glitch filter with variable delay stages 400 further comprises a multiplexer element, e.g., multiplexer element 442 of selectable delay stage 440. In general, the multiplexer element of a selectable delay stage selects between a signal present at the output of the associated delay stage delay element and a signal propagated from subsequent delay stages.

Multiplexer element 442 selects between a signal propagated from subsequent delay stages, e.g., signal 451 propagated from the multiplexer element of selectable delay stage 450, and signal 452 associated with its own selectable delay stage 440. A bit value in latch 455 determines which signal, 451 or 452, is selected by multiplexer element 442. A more detailed description of the operation of multiplexer element 442 is presented in co-pending, commonly owned U.S. patent application Ser. No. 11/021,632, filed Dec. 23, 2004, entitled "Power Efficient Multiplexer" to Masleid, incorporated herein by reference in its entirety.

For example, if multiplexer element 442 selects the output of another multiplexer element, e.g., signal 451, more delay elements have delayed an original signal, and the total delay is longer. In contrast, if multiplexer element 442 selects the output of its own delay element, e.g., signal 452, fewer delay elements have delayed an original signal, and the total delay is lessened.

In general, variable delay lines, for example, the variable delay line formed by selectable delay stages 440 and 450, can generate "glitches" or deleterious spurious signals. For example, changing a multiplexer control signal while a transition is propagating through the delay line can sometimes cause the transition to arrive twice at the output, producing a glitch.

Coincidence detector element 430 generally corresponds to coincidence detector element 130 of FIG. 1. Referring once again to FIG. 4, it is to be appreciated that the variable delay line formed by selectable delay stages 440 and 450 produces a delayed version of input signal A 411. That delayed version of input signal A 411 is signal B 421. As described previously, coincidence detector element 430 does not change state until input signal A 411 and signal B 421 coincide, or are at the same level.

Advantageously, any glitch produced by incrementing the delay of a separate variable delay line formed by selectable delay stages similar to stages 440 and 450 will generally be of shorter duration than the delay produced by delay stages 440 and 450, when the appropriate latches are set to one. As coincidence detector element 430 serves to filter glitches of duration less than the delay between its inputs, e.g., the delay between signal A 411 and signal B 421, coincidence detector element 430 will generally filter any glitch shorter than the total delay of delay stages 440 and 450.

For example, if a separate variable delay line is incremented two stages at a time, then the glitch filter should contain a delay of four stages to allow for a 2:1 process mismatch.

It is to be appreciated that this general timing relationship will hold for a plurality of delay stages, in accordance with embodiments of the present invention.

Optional input buffer 410 can provide transition speed isolation. For example, without optional input buffer 410, leakage efficient anti-glitch filter with variable delay stages 400 presents six loads at its input. Such loading may represent an undesirable loading condition to the source of a signal. In accordance with embodiments of the present invention, input buffer 410 is well suited to a variety of buffering structures, including, for example, conventional or stacked inverters and non-inverting buffers.

A timing diagram for signals A 441, B 421 and C 431 of FIG. 4 corresponds to timing diagram 200 of FIG. 2. Signal B 421 is a delayed version of signal A 441. It is appreciated that delay is a primary function of selectable delay stages 440 and 450. It is to be further appreciated that, in general, a delay produced by selectable delay stages 440 and/or 450 will comprise a different duration than a delay produced by leakage efficient delay line 120 of FIG. 1.

As described previously, coincidence detector element 430 does not change state until input signal A 411 and signal B 421, a delayed version of signal A 411, coincide, or are at the same level. It is appreciated that a desired transition of signal C 431, corresponding to a desired transition of signal A 411, does not occur until both signal A 411 and signal B 421 agree.

Thus, in accordance with embodiments of the present invention, a spurious signal, e.g., a glitch applied to the variable delay line formed by selectable delay stages 440 and/or 450 is removed and is not present on the output signal C 431 of leakage efficient anti-glitch filter with variable delay stages 400 if the glitch present on the input of selectable delay stage 440 is of less duration than the delay produced by selectable delay stages 440 and/or 450.

It is to be appreciated that signal C 431 is inverted relative to signal A 411. The output of leakage efficient anti-glitch filter with variable delay stages, e.g., signal C 431, can be inverted by an inverting circuit (not shown) to obtain a positive phase relationship to a signal input to leakage efficient anti-glitch filter 100. Alternatively, an inverting optional input buffer 410 can "pre-invert" a signal input to leakage efficient anti-glitch filter with variable delay stages 400 in order to obtain a positive phase relationship between an input signal and an output signal.

Figure 5:
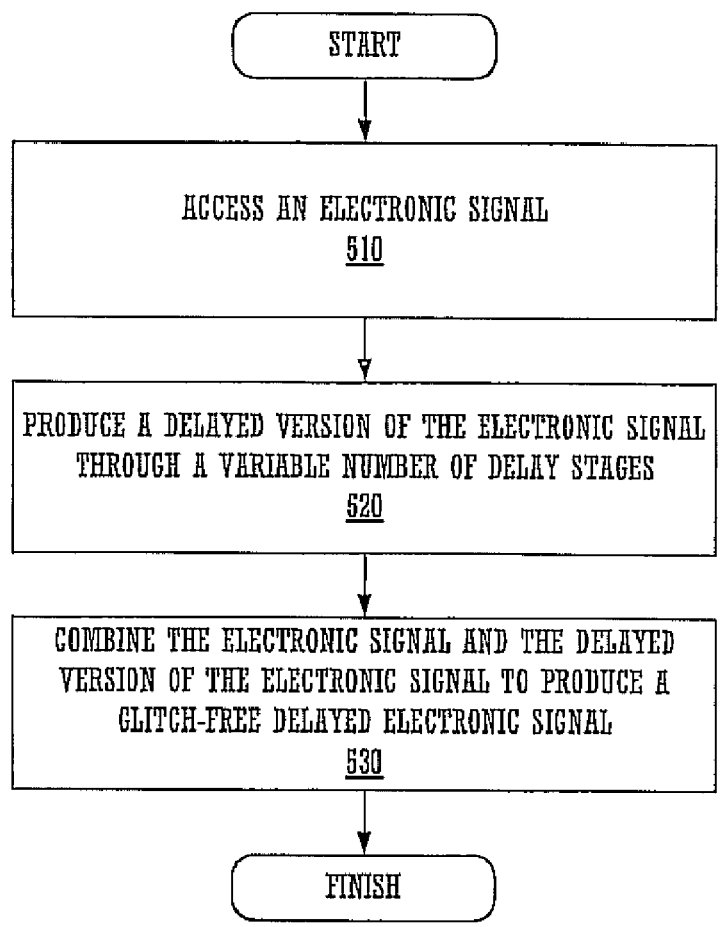
FIG. 5 illustrates a flow chart describing a method of delaying an electronic signal, in accordance with embodiments of the present invention.

FIG. 5 illustrates a flow chart describing a method 500 of delaying an electronic signal, in accordance with embodiments of the present invention. In 510, an electronic signal is accessed. For example, referring once again to FIG. 4, signal A 411 is accessed by selectable delay stage 440.

In 520, a delayed version of the electronic signal is produced through a variable number of delay stages. For example, signal B 421 is a delayed version of signal A 411 in FIG. 4. Signal B 421 can be delayed through a variable number of delay stages, e.g., selectable delay stages 440 and/or 450.

In 530, the electronic signal and the delayed version of the electronic signal are combined to produce a glitch-free delayed electronic signal. The glitch-free delayed electronic signal transitions in response to a coincidence of the electronic signal and the delayed version of the electronic signal.

Embodiments in accordance with the present invention thus provide a leakage efficient anti-glitch filter with variable delay stages comprising desirable static power (leakage current) consumption in comparison to the conventional art.

Embodiments in accordance with the present invention, leakage efficient anti-glitch filter, are thus described. While the present invention has been described in particular embodiments, it should be appreciated that the present invention should not be construed as limited by such embodiments, but rather construed according to the below claims.

What is claimed is:

1. An anti-glitch filter circuit comprising:
   a delay element comprising a stacked gate configured to produce a variable delay; and
   a coincidence detector element configured to detect coincidence of an input signal to the delay element and an output signal of the delay element, wherein the coincidence detector element includes a glitch-filtered output signal output,
   wherein said variable delay is configured for digital control.

2. The anti-glitch filter circuit of claim 1, wherein the glitch-filtered output signal output is configured such that spurious signals having a duration of less than a delay of the delay element are substantially eliminated.

3. The anti-glitch filter circuit of claim 2, wherein the coincidence detector element comprises a Mueller-C element.

4. The anti-glitch filter circuit of claim 2, wherein the stacked gate comprises a NAND gate.

5. The anti-glitch filter circuit of claim 1 wherein the stacked gate comprises a stacked NAND-gate circuit.

6. The anti-glitch filter circuit of claim 5 wherein the stacked NAND-gate circuit comprises at least two p-type devices and at least two n-type devices.

7. The anti-glitch filter circuit of claim 6 wherein the stacked NAND-gate circuit is configured to have a greater switching time duration than an inversion performed by an inverter comprising only four active devices.

8. The anti-glitch filter circuit of claim 6 wherein the stacked NAND-gate circuit is configured to have less leakage current than an inverter comprising only four active devices.

9. The anti-glitch filter circuit of claim 6, wherein the stacked NAND-gate circuit comprises:
   a first plurality of devices of a first type coupled in series; and
   a second plurality of devices of a second type coupled in series, wherein the second type is opposite to the first type;
   wherein the first and the second pluralities of devices are coupled in series and include at least five active devices.

10. A method of delaying an electronic signal, the method comprising:
    accessing an electronic signal;
    producing a delayed version of the electronic signal through a digitally controlled variable delay stage; and
    combining the electronic signal and the delayed version of the electronic signal to produce a substantially glitch-free delayed electronic signal, wherein the glitch-free delayed electronic signal transitions in response to a coincidence of the electronic signal and the delayed version of the electronic signal.

11. The method of claim 10, wherein said combining comprises filtering glitches characterized as having a duration of less than a delay of said delayed version of said electronic signal.

12. The method of claim 10, wherein said combining is performed using a Mueller-C element.

13. The method of claim 10, wherein said producing is performed using a plurality of inverters.

14. The method of claim 13, wherein the plurality of inverters comprise a stacked inverter circuit.

15. The method of claim 14, wherein the stacked inverter circuit comprises at least two p-type devices coupled in series with at least two n-type devices.

16. The method of claim 15, wherein the stacked inverter circuit has a greater switching time duration than an inversion performed by an inverter comprising only two active devices.

17. The method of claim 15, wherein the stacked inverter circuit has less leakage current than an inverter comprising only two active devices.

18. The method of claim 15, wherein the stacked inverter circuit comprises:
    a first plurality of devices of a first type coupled in series; and
    a second plurality of devices of a second type coupled in series, wherein the second type is opposite to the first type;
    wherein the first and the second pluralities of devices are coupled in series and comprise at least five active devices.

19. An electronic circuit comprising:
    a plurality of delay stages including a plurality of stacked inverters coupled in series, wherein each of the plurality of stacked inverters comprise:

at least two devices of a first type coupled in series, wherein the at least two devices of a first type are further coupled in series to at least two devices of a second type coupled in series;

wherein the second type is opposite to the first type;

a plurality of multiplexers corresponding to the plurality of delay stages and configured to select between a signal present at a desired delay stage and a signal propagating from beyond a delay stage corresponding to a multiplexer; and a coincidence detector circuit including first and second devices of a first type coupled in series, wherein the first and second devices of a first type are further coupled in series to third and fourth devices of a second type coupled in series.

20. The electronic circuit of claim 19, wherein gates of each device of the plurality of stacked inverters are coupled together.

* * * * *